United States Patent [19]

Ikeda

[11] Patent Number: 4,847,575
[45] Date of Patent: Jul. 11, 1989

[54] NOISE FILTER HAVING MULTIPLE LAYERS ROLLED INTO AN ELLIPTICAL SHAPE

[76] Inventor: Takeshi Ikeda, 5-6-213 Sanno-2, Ohta-Ku, Tokyo 143, Japan

[21] Appl. No.: 141,321

[22] Filed: Jan. 6, 1988

[30] Foreign Application Priority Data

Jan. 14, 1987 [JP] Japan ................. 62-004968

[51] Int. Cl.$^4$ .................... H03H 7/01; H03H 7/09
[52] U.S. Cl. ................... 333/184; 333/185; 361/313; 361/303
[58] Field of Search ............... 333/181, 184, 185, 23; 361/303, 306, 313, 328-330

[56] References Cited

U.S. PATENT DOCUMENTS

| | | | |
|---|---|---|---|
| 2,000,441 | 5/1935 | Given | 333/184 |
| 2,260,296 | 10/1941 | Christopher et al. | 333/184 |
| 2,884,605 | 4/1959 | Dubilier | 361/329 X |
| 3,365,632 | 1/1968 | Grahame | 361/330 |
| 4,048,593 | 9/1977 | Zillman | 333/185 |
| 4,563,658 | 1/1986 | Ikeda | 333/181 |

FOREIGN PATENT DOCUMENTS 1220083 1/1971 United Kingdom ............. 361/328

Primary Examiner—Eugene R. Laroche
Assistant Examiner—Benny Lee
Attorney, Agent, or Firm—Allston L. Jones

[57] ABSTRACT

A distributed constant type noise filter and method of making same is provided. The filter includes a first foil conductor disposed to conduct electrical current with first and second lead wires connected near each end thereof, a second foil conductor disposed to be connected to ground potential having a third lead wire connected near one end thereof, and a plurality of dielectric sheets disposed between said first and second foil conductors. This sandwich is wound generally into a tubular form with said first and third lead wires being close to each other and shifted by approximately $\frac{1}{4}$ to $\frac{3}{4}$ of a turn. The second lead wire is arranged substantially in-line with said first and third lead wires after the tubular wound filter is compressed into substantially an elliptical shape. Alternatively, the sandwich is wound generally into a tubular form with said third lead wire being close to said first lead wire but separated therefrom by substantially 2.5% of the distance between said first and second lead wires.

5 Claims, 4 Drawing Sheets

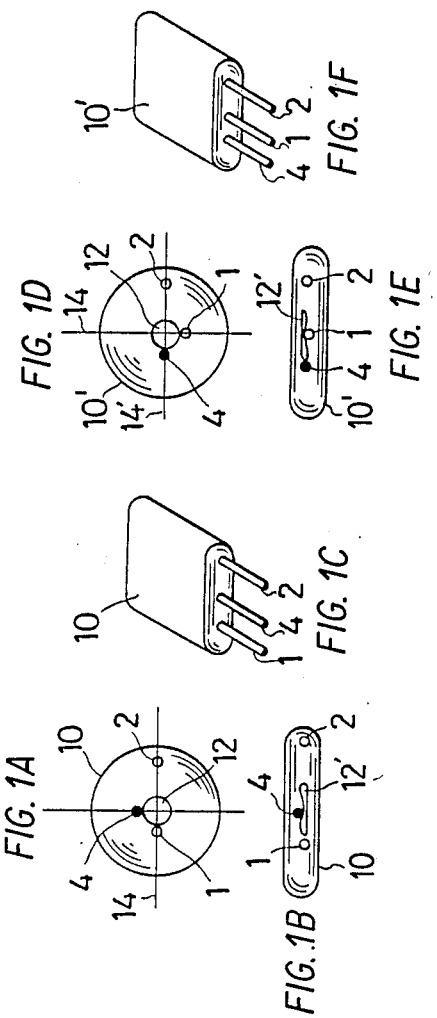

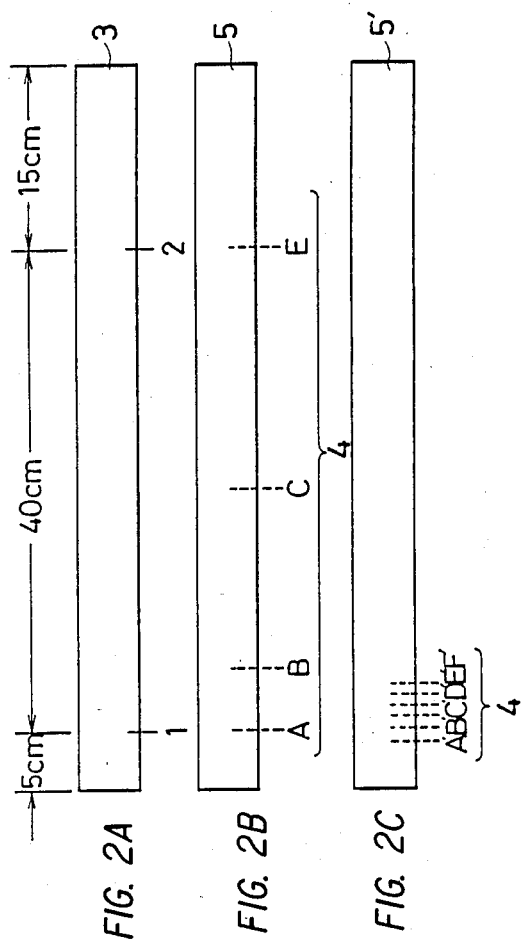

NOISE FILTER HAVING MULTIPLE LAYERS ROLLED INTO AN ELLIPTICAL SHAPE

BACKGROUND OF THE INVENTION

The present invention pertains generally to a noise filter, more specifically to a filter particularly suited for suppressing noise and ripple components in power supply circuits and power circuits for analog and digital ICs, or the like.

Electronic circuits are normally designed to operate on a DC power supply voltage obtained from a battery, or AC power line in conjunction with a rectifier circuit. DC-DC converters (also known as switching type regulators) are commonly used for obtaining one or more DC voltages of any desired magnitude. Transient currents caused by switching or other electrical phenomena, including load fluctuations due to the switching operation of digital ICs or the like, introduce large amount of noise of various frequency components into power supply circuits. Such noise may cause malfunctions or reduce the S/N ratio of other nearby electronic equipment or appliances through lower supply line or electrical radiation if they are not suppressed.

Noise filters are used to protect or reduce such noise. Additionally, industry standards and governmental regulations have become increasingly strict because of the noise interference effects on a variety of high performance and sensitive electronic equipment now in use.

Almost all commercially available noise filters are of two types: a combination of discrete inductors and capacitors, or lumped LC (inductance-capacitance) device comprising a capacitor and bead cores mounted around its lead wires to increase inductance. Within the last five to ten years a distributed constant type noise filter has appeared in the literature. An example of such a filter is the subject of the present applicant's U.S. Pat. No. 4,563,658 that issued on Jan. 7, 1986, and is illustrated in FIGS. 7A-7C of the present specification. FIG. 7A shows the construction details of this type of noise filter, namely a belt-shaped current carrying conductor 3 and similar ground connector 5 such as aluminum laminated with relatively wide dielectric sheets 6 and wound in a generally tubular form 10 as shown in FIG. 7B. Coupled near both ends of the current carrying conductor 3 are lead wires 1 and 2. Also coupled near one end of the ground conductor 5 is a ground lead wire 4. When spirally wound, an inductance is formed between both lead wires 1 and 2, the value of that inductance being proportional to the number of turns that the conductors are wound into and the length of the current carrying conductor 3. Also, a large capacitance occurs between the current carrying conductor 3 and the ground conductor 5 as a result of their proximity, i.e. being spaced apart from each other by a thin dielectric sheet 6. A schematic representation of the equivalent circuit of the resulting distributed constant type noise filter is shown in FIG. 7C.

Such distributed constant type noise filters are relatively simple and yet have relatively good attenuation characteristics over a wide frequency range. To date, no one has attempted to commercially make such noise filters. The primary reasons include difficulty in making electrical connections to the at least three lead wires because of the relatively small size of the filter. Low production yield is another problem and thus, its previous unsuitability to quantity production because of large differences in attenuation characteristics and lead wire misalignment.

It is desirable to have a noise filter that is inexpensive and easy to produce that consistently has good attenuation characteristics and lead wire alignment. The present invention provides such a noise filter and a method of producing same.

SUMMARY OF THE INVENTION

In accordance with the present invention there is provided a distributed constant type noise filter having a first foil conductor disposed to conduct electrical current with first and second lead wires connected near each end thereof, a second foil conductor disposed to be connected to ground potential having a third lead wire connected near one end thereof, and a plurality of dielectric sheets disposed between said first and second foil conductors. This sandwich is wound generally into a tubular form with said first and third lead wires being close to each other and shifted by approximately ¼ to ¾ of a turn. The second lead wire is arranged substantially in-line with said first and third lead wires after the tubular wound filter is compressed into substantially an elliptical shape.

Alternately, the sandwich is wound generally into a tubular form with said third lead wire being close to said first lead wire but separated therefrom by substantially 2.5% of the distance between said first and second lead wires.

It is therefore an object of this invention to provide a distributed constant type noise filter which is uniform in attenuation characteristics, compact, and yet suitable for quantity production.

BRIEF DESCRIPTION OF THE FIGURES

FIGS. 1A-1F diagramatically show construction details of first and second embodiments of the present invention.

FIGS. 2A-2C show various lead wire placement locations on the two conductor strips of the noise filter that correspond to the performance data curves of FIGS. 3-5.

FIGS. 3-5 show graphically the attenuation characteristics of various sample noise filters of the present invention.

DESCRIPTION OF THE PREFERRED EMBODIMENTS

Figure 7A:
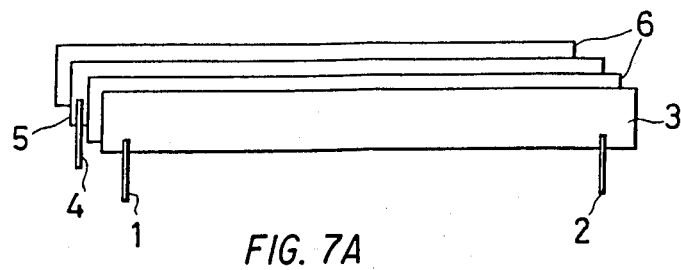
FIG. 7A shows the arrangement of the elements of the noise filter of the present and prior inventions.
Figure 7B:
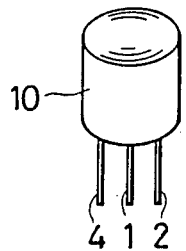
FIG. 7B shows a perspective view of the assembled noise filter of the present and prior inventions.
Figure 7C:
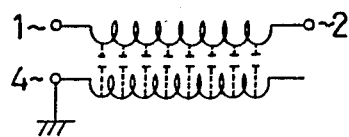
FIG. 7C is a schematic representation of the inductance and distributed capacitance of the noise filter of the present and prior inventions.

Referring now to FIGS. 1A-1C and FIGS. 1D-1F there is shown several view of each of a first and a second embodiment of the present invention. In each of these embodiments the initial lay-out of the component parts of the present invention are as shown in FIG. 7A which has been discussed above.

From the lead wire 1, 2 and 4 end, FIGS. 1A and 1D are views of the wound filter 10 and 10', respectively, while FIGS. 1B and 1E are views of the compressed windings 10 and 10', respectively. FIGS. 1C and 1F are perspective views of the completely assembly noise filters 10 and 10'. Note, that for purposes of illustration, the winding direction of conductors 3 and 5 (see FIG. 7A), and dielectric sheets 6 has been selected to be clockwise, however, comparable results can be had in filters of the same construction wound in the counter-clockwise direction.

In the first embodiment shown in FIGS. 1A–1C the noise filter of the present invention is constructed by placing a first lead wire 1 of current carrying conductor 3 around a shift 12 of about 2 to 3 mm in diameter. A ground lead wire 4 of ground conductor 5 is then placed at ¼ to ½ rotary position, or turn, in the clockwise direction from the first lead wire 1. Then, both of the current carrying conductor 3 and the ground conductor 5 of predetermined length are wound continuously in the clockwise direction with the second lead wire 2 of the current carrying conductor 3 coming on or near the extension line 14 coupling the first lead wire 1 and the center of the shaft 12. The end of the winding 10 is glued before removing winding 10 from the shaft 12. The winding 10 is then compressed in a direction perpendicular to the line 14, thereby deforming the center space 12' from which shaft 12 was removed, as shown in FIG. 1B with the finished filter having a cross-sectional shape that is substantially elliptical. Thereby lead wires 1, 2 and 4 are substantially in line with each other with substantially increased space between each two adjacent lead wires. Ground lead wire 4 may, alternatively, be placed about ¼ 1/4 turn ahead of first lead wire 1 to make a symmetrical lead wire arrangement with respect to the line 14. The finished noise filter comprises a generally oval winding portion 10' with three inline lead wires 1, 2 and 4 extending from one side thereof. The winding portion 10' may be placed in a casing made of a metal foil or provided with a protective coating of epoxy or other suitable material. In this particular embodiment of the noise filter of the present invention, the ground lead wire 4 is between the first and second lead wires 1 and 2 of the current carrying conductor 3.

The second embodiment of the noise filter of the present invention is shown in FIGS. 1D–1F, with it being constructed with the first lead wire 1 and the ground lead wire 4 shifted by about ¼ turn from the orientation shown in FIG. 1A with the second lead wire 2 on the extension line 14' together with ground lead wire 4. When the winding is compressed in perpendicular to the extension line 14' as shown in FIG. 1E, the three lead wires are arranged in line with lead 4 shown on the left, lead 2 on the right, and lead 1 intermediate leads 4 and 2. Unlike the first embodiment shown in FIG. 1A, the ground lead wire 4 may alternatively be placed ahead of the first lead wire 1 by about ¼ turn to provide a symmetrical lead wire arrangement with respect to the line 14' (i.e. position of lead wires 1 and 4 are reversed from the positions shown in FIG. 1A).

Attenuation characteristics of the noise filter of the present invention are illustrated by, and described with reference to, FIGS. 2 through 6.

Figure 5:
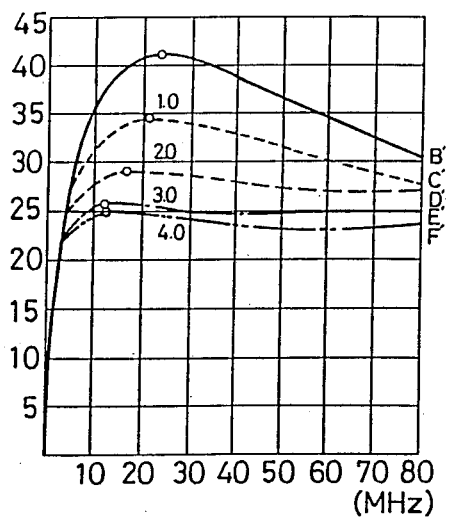
Figure 6A:
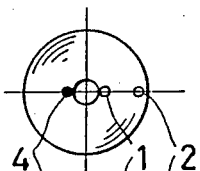
FIGS. 6A-6D diagramatically show construction details of third and fourth embodiments of the present invention.
Figure 6B:
Figure 6C:
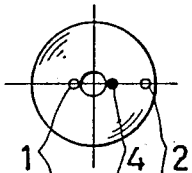
Figure 6D:

In FIGS. 2A–2C there are shown the unwound current carrying and ground conductors 3 and 5 with the relative positions of the first and second lead wires 1 and 2, and the ground lead wire 4 for each of the attenuation characteristic curves of FIGS. 3–5. In experiments to study the effects of lead placement, aluminum foil of 60 cm long, 10 mm wide and 50 μm thick were used for the conductors 3 and 5 as shown in FIG. 2. A mylar tape of 12 mm wide and 25 m thick was used for the dielectric sheets 6 (not shown in FIG. 2). A wire of 0.8 mm in diameter was used for the lead wires 1, 2 and 4. As shown in FIG. 2A, the first lead wire 1 is connected to the current carrying conductor 3 at 5 cm from the left end. The distance between the first and second lead wires 1 and 2 is chosen to be about 40 cm with the conductors of this length resulting in a coil of about 25 turns. The ground lead wire 4 of the ground conductor 5 is set to position B shifted to the right by 2 cm from the first lead wire position A, the midpoint C between both lead wires 1 and 2, and position E substantially equal to the position of the second lead wire 2.

Attenuation characteristic curves of these noise filter samples are shown in FIG. 3. It is apparent that the noise filters having the ground lead wire 4 connected very close to either the first lead wire 1 or the second lead wire 2 (positions A and E) exhibit excellent attenuation characteristics and that attenuation decreases significantly making the filter impractical to use if the ground lead wire 4 is spaced apart from either the first or the second lead wires 1 and 2 as at positions B, or C. However, having both lead wires 1 and 4 or 2 and 4 close together and only separated by the thin dielectric sheet 6 at positions A or E is not practical because of the potential danger of a short-circuit developing between such lead wires in the wiring or the soldering operation.

Experiments were made on the attenuation characteristics with noise filter samples having the ground lead wire 4 sequentially shifted from the reference position B' corresponding to the first lead wire 1 by 0.5 cm as shown by positions A' through F' on ground conductor 5' in FIG. 4. FIG. 2C shows that attenuation reaches the maximum at position B' where the ground lead wire 4 overlaps the first lead wire 1 and decreases as it departs from the first lead wire 1. Apparently, the attenuation characteristic variations of the noise filter is independent of the direction in which the ground lead wire 4 deviates from the position of the first lead wire 1. That is, the ground lead wire may lead or lag in the winding procedure with respect to the first lead wire 1. The experiments also show that only 0.5 cm shift (1.25% of the entire length of the conductor between the lead wires 1 and 2) causes about 6 dB drop in the maximum attenuation (about 16% but about ½ on a linear scale) and about 11 dB (about 29%) for the 1 cm (2.5%) shift.

Similar experiments were made with other noise filter samples using a current carrying conductor 3 and a ground conductor 5 that were each about 100 cm in total length with 80 cm between the first lead wire 1 and the second lead wire 2. These tests were performed to verify the attenuation characteristics of the noise filters of the present invention for different sizes. FIG. 5 shows the results of those tests. That is, when the curves of FIGS. 4 and 5 are compared, the curves of FIG. 5 show that the maximum attenuation drops about 5 dB as ground lead wire 4 departs form the first lead wire 1 as much as 1 cm, which is substantially the same proportion as that of the first sample with respect to the distance between the first lead wire 1 and the second lead wire 2.

As understood from the above description, it is important to wind foil type distributed constant noise filters of the present invention around a sufficiently small diameter shaft 12 with the first lead wire 1 of the current carrying conductor 3 and the ground lead wire 4 of the ground conductor 5 shifted by about ¼ to ½ turn, or about ¼ to ¾ turn in case of fairly large distance between the first lead wire 1 and the second lead wire 2.

Needless to say that excellent attenuation is impossible for such noise filters having the first lead wire 1 and the ground lead wire 4 departing more than 1 turn even if their angular separation is ¼ to ½ (or ¾) of the complete rotation. In the event the ground lead wire 4 is located close to the second lead wire 2, the outer diameter of the winding section 10 of the noise filter is so large that shifting the ground lead wire 4 from the second lead wire 2 by, for example ½ turn for in-line alignment of the three lead wires results in a considerably large displacement of lead 4 from the second lead wire 2, thereby causing a significant drop in the attenuation characteristics of the filter. Consequently, the noise filter designs shown in FIG. 1 are more suitable in uniformity of electrical characteristics and for quantity production.

The arrangement of the first lead wire 1, the second lead wire 2 and the ground lead wire 4 may be as shown in either FIG. 1C or FIG. 1F for use at relatively low frequency ranges, but the arrangement of FIG. 1C having the ground lead wire 4 between the first and second lead wires 1 and 2 is preferable for use at higher frequency ranges (100 MHz or higher). It is believed that high frequency components of the input signal tend to directly couple from the first lead wire 1 to the second lead wire 2, which are relatively close to each other in the configuration of FIG. 1F. Also, it is more effective to use a wider ground conductor than the current carrying conductor. The first and second lead wires may be used as the signal input and output terminals or vice versa. However, the attenuation characteristic curve of Fig. 3A is for the first and second lead wires as the input and output terminals, respectively. On the other hand, the attenuation characteristic curve E of FIG. 3 is for the so-called choke-input type noise filter replacing the first and second lead wires from the capacitor-input type. The latter noise filter provides larger attenuation at relatively low frequencies of about 100MHz, but attenuation drops at the 30 to 50 MHz frequency range. It suggests that cascade connection of these two different noise filters provides a composite noise filter of excellent attenuation over a wide frequency range.

In the case of noise filters using relatively long current carrying and ground conductors 3 and 5, with a relatively large number of turns, the ground lead wire 4 and the first lead wire 1 may be separated by about ½ turn with the second lead wire 2 on the extension line coupling the ground lead wire 4 and the first lead wire 1 as shown in FIGS. 6A-6D. The ground lead wire 4 is in the outer position for the embodiment of FIGS. 6A and 6B, while intermediate the first and second lead wires 1 and 2 for the embodiment of Figs. 6C and 6D. In these embodiments, the distance between the first lead wire 1 and the ground lead wire 4 is about 5 mm in the finished noise filter that was around a shaft 12 of 3 mm in diameter.

In summary, the winding shaft is chosen to be small enough (approximately 2 to 3 mm) and the distance between the first lead wire of the current carrying conductor and the ground lead wire of the ground conductor in the range of approximately ¼ to ¾ turns, more preferably to ¼ to ½ turns. The second lead wire of the current carrying conductor is on or near the extension line joining the central axis and the first or ground lead wire. In this manner, the distance between the first lead wire and the ground lead wire is several percent or less, preferably 2.5% or less of the entire distance between the first and second lead wires when the current carrying conductor and the ground conductor are spread.

After winding, the wound conductors and dielectric films are removed from the shaft and pressed into an oval shape in such direction that the three lead wires align in a substantially straight line. The winding may be coated with epoxy or other suitable resin to keep it wound.

Although each of the aforementioned noise filters were made using a single current carrying conductor 3 and a single ground conductor 5, this invention is applicable to common mode type noise filters using two pairs of current carrying and ground conductors. In the common mode configuration, the first and ground lead wires of each current carrying and ground conductor pairs are shifted by about a half turn with respect to the winding shaft.

Also, the ground conductor 5 may be divided into two or more sections, rather than the continuous or single piece of the above discussed embodiments, with a ground lead wire connected to each ground conductor section. The use of a divided ground conductor helps to increase the maximum attenuation of the filter. It is necessary in this example to maintain the above mentioned relationship between the first lead wire 1 of the current carrying conductor 3 and the ground lead wire 4 of the ground conductor 5 for obtaining uniform attenuation characteristics. That is, the first lead wire 1 and the ground lead wire of the first ground conductor section are positioned close to each other.

A magnetic core may also be inserted in the center of the winding, or a magnetic conductor may be used as the current carrying or ground conductor in order to increase the inductance of the filter.

As described above, the distributed constant type noise filter according to this invention sets the first lead wire of the current carrying conductor and the ground lead wire of the ground conductor within 1 turn, more preferably ¼ to ¾ of a turn and the second lead wire of the current carrying conductor on or near the extension line including the center of the winding shaft and the first or ground lead wire. In this way, the attenuation characteristics of the noise filter are well controlled within a certain predictable range and the three lead wires are positioned in a predetermined in-line arrangement, thereby enabling one to repeatedly manufacture noise filters of the present invention with substantially consistent lead spacing and attenuation characteristics. Consequently, this invention overcomes problems associated with conventional noise filters including non-uniformity in electrical characteristics and low production yields.

Although only preferred embodiments of this invention have been described and demonstrated, the scope of this invention is by no means limited to such embodiments. A person skilled in the art can easily modify this invention for his or her particular applications without departing from the scope of this invention. For example, the width of the conductive bands and the thickness of the insulative separators can be chosen as dictated by the current value flowing through the coil and the voltage applied thereto. The electromagnetically conductive film may be amorphous iron or mumetal, or a lamination of electrically conductive and magnetically conductive layers. The noise filters find wide application and more than one filter can be connected in cascade to provide higher noise attenuation. Such cascaded noise filters may also be integrated into a single device by a simple extension of the present invention. Therefore, such changes and modification are within the scope of this invention and the protection afforded this invention is only limited by the scope of the following claims.

What is claimed is:

1. A distributed constant type noise filter comprising:
    a lamination including:
        a first foil layer of an electrically conductive material of a selected length;
        a second foil layer of an electrically conductive material of substantially the same selected length as the first foil layer;
        a first insulative layer that is substantially the same selected length as said first foil layer and located intermediate the first and second foil layers; and
        a second insulative layer that is substantially the same selected length as said first foil layer and located on the other side of one of the first and second foil layers from the first insulative layer;
        said lamination wound in substantially an elliptical shape, said elliptical shape having a long and a short axis with each of the ends of the four layers substantially in alignment;
    a first terminal connected to the first foil layer near the end that is in the inner most portion of the lamination and disposed substantially along the long axis of the elliptical shape of the lamination;
    a second terminal connected to the first foil layer near the end that is in the outer most portion of the lamination, substantially along the long axis of the elliptical shape of the lamination, and extending from the same surface of the lamination as the first terminal; and
    a third terminal connected to the second foil layer near the end that is in the inner most portion of the lamination within approximately $\frac{1}{4}$ to $\frac{3}{4}$ of a turn with respect to the position of said first terminal, said third terminal disposed substantially along the long axis of the elliptical shape of the lamination, and extending from the same surface of the lamination as the first terminal.

2. A noise filter of claim 1 wherein said third terminal is positioned substantially between said first and second terminal.

3. A noise filter as in claim 1 wherein:
    said first foil layer has a selected width; and
    said second foil layer has a selected width that is slightly wider than the selected width of the first foil layer.

4. A noise filter as in claim 1 wherein said lamination has a protective coating to seal the filter.

5. A distributed constant type noise filter comprising:
    a lamination including:
        a first foil layer of an electrically conductive material of a selected length;
        a second foil layer of an electrically conductive material of substantially the same selected length as the first foil layer;
        first insulative layer that is substantially the same selected length as said first foil layer and located intermediate the first and second foil layers; and
        a second insulative layer that is substantially the same selected length as said first foil layer and located on the other side of one of the first and second foil layers from the first insulative layer;
        said lamination wound in substantially an elliptical shape, said elliptical shape having a long and a short axis with each of the ends of the four layers substantially in alignment;
    a first terminal connected to the first foil layer near the end that is in the inner most portion of the lamination and disposed substantially along the long axis of the elliptical shape of the lamination;
    a second terminal connected to the first foil layer near the end that is in the outer most portion of the lamination, substantially along the long axis of the elliptical shape of the lamination, and extending from the same surface of the lamination as the first terminal; and
    a third terminal connected to the second foil layer near the end that is in the inner most portion of the lamination and spaced away from the point on the second foil layer that is adjacent the position of the first terminal on the first foil layer by up to 2.5% of the actual spacing between the first and second terminals along the surface of the first foil layer, said third terminal disposed substantially along the long axis of the elliptical shape of the lamination, and extending from the same surface of the lamination as the first terminal.

* * * * *